US012618909B2

(12) United States Patent (10) Patent No.: US 12,618,909 B2
Matsuoka (45) Date of Patent: May 5, 2026

(54) DETERMINATION SYSTEM, VEHICLE, AND DETERMINATION METHOD

(71) Applicant: TOYOTA JIDOSHA KABUSHIKI KAISHA, Toyota (JP)

(72) Inventor: Shohei Matsuoka, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 231 days.

(21) Appl. No.: 18/494,457

(22) Filed: Oct. 25, 2023

(65) Prior Publication Data

US 2024/0192277 A1 Jun. 13, 2024

(30) Foreign Application Priority Data

Dec. 12, 2022 (JP) .................................. 2022-197650

(51) Int. Cl.
*G01R 31/3835* (2019.01)
*G01R 31/374* (2019.01)
(Continued)

(52) U.S. Cl.
CPC ....... *G01R 31/374* (2019.01); *G01R 31/3835* (2019.01); *H01M 10/425* (2013.01);
(Continued)

(58) Field of Classification Search
CPC .............. G01R 31/374; G01R 31/3835; G01R 31/367; G01R 31/382; G01R 31/3865;
(Continued)

(56) References Cited

U.S. PATENT DOCUMENTS

| | | | | |
|---|---|---|---|---|
| 2003/0102842 A1* | 6/2003 | Tamai | ............... | H01M 10/4285 |
| | | | | 320/106 |
| 2010/0213891 A1* | 8/2010 | Nishikawa | ............ | H01M 10/42 |
| | | | | 320/106 |

(Continued)

FOREIGN PATENT DOCUMENTS

| | | |
|---|---|---|
| JP | 2006-339070 A | 12/2006 |
| JP | 2008-060032 A | 3/2008 |

(Continued)

*Primary Examiner* — Raul J Rios Russo
*Assistant Examiner* — Haidong Zhang
(74) *Attorney, Agent, or Firm* — Oliff PLC

(57) ABSTRACT

A battery ECU is a system that determines a battery assembly that stores power used for running a vehicle and that is mounted on the vehicle in a replaceable state, the system comprising: a processor; a memory that stores a genuine product characteristic that is a temperature change characteristic of a genuine product, the temperature change characteristic being a characteristic of an index which changes with temperature of the battery assembly and when not being charged or discharged; and a sensor that acquires a determination target characteristic that is a temperature change characteristic of the index of the battery assembly after replacement mounted on the vehicle when not being charged or discharged. The processor compares the determination target characteristic acquired by the sensor with the (Continued)

genuine product characteristic stored in the memory, and determines whether the battery assembly mounted on the vehicle is the genuine product from a comparison result.

8 Claims, 9 Drawing Sheets

(51) Int. Cl.
| | |
|---|---|
| *H01M 10/42* | (2006.01) |
| *H01M 10/48* | (2006.01) |
| *H01M 50/209* | (2021.01) |
| *B60L 58/10* | (2019.01) |

(52) U.S. Cl.
CPC ....... *H01M 10/482* (2013.01); *H01M 10/486* (2013.01); *H01M 50/209* (2021.01); *B60L 58/10* (2019.02); *H01M 2220/20* (2013.01)

(58) Field of Classification Search
CPC .............. G01R 31/396; H01M 10/425; H01M 10/482; H01M 10/486; H01M 50/209; H01M 2220/20; H01M 10/48; H01M 10/441; B60L 58/10; B60L 50/64; B60L 2240/545; B60L 2240/547; B60L 58/24; B60L 3/00; B60L 3/0046; B60L 50/66; B60L 53/80; Y02E 60/10
See application file for complete search history.

(56) References Cited

U.S. PATENT DOCUMENTS

| | | | | |
|---|---|---|---|---|
| 2013/0110430 A1* | 5/2013 | Nishi | .................. | G01R 31/382 |
| | | | | 702/63 |
| 2019/0195957 A1* | 6/2019 | Chiba | .................. | G01R 31/367 |
| 2022/0128629 A1* | 4/2022 | Tominaga | ........... | G01R 31/386 |

FOREIGN PATENT DOCUMENTS

| | | |
|---|---|---|
| JP | 2012-252896 A | 12/2012 |
| JP | 2015-195096 A | 11/2015 |
| JP | 2019-114437 A | 7/2019 |
| JP | 2022-076670 A | 5/2022 |

\* cited by examiner

DETERMINATION SYSTEM, VEHICLE, AND DETERMINATION METHOD

CROSS REFERENCE TO RELATED APPLICATIONS

This nonprovisional application is based on Japanese Patent Application No. 2022-197650 filed on Dec. 12, 2022 with the Japan Patent Office, the entire contents of which are hereby incorporated by reference.

BACKGROUND

Field

This disclosure relates to a determination system, a vehicle, and a determination method, and in particular to a determination system for a secondary battery that stores power used for running a vehicle and that is mounted on the vehicle in a replaceable state, a vehicle on which the determination system for a secondary battery is mounted, and a determination method using the determination system for a secondary battery that stores power used for running a vehicle and that is mounted on the vehicle in a replaceable state.

Description of the Background Art

Conventionally, in order to provide a semiconductor device capable of accurately detecting a battery cell that is a non-genuine product, there has been a technique that counts the number of cycles of charging and discharging of a battery cell, measures the charging rate and internal resistance of the battery cell, normalizes the internal resistance based on the number of cycles, temperature, and the charging rate to calculate the internal resistance at the time of shipping of the battery cell, and performs a process of determining whether the battery cell is a non-genuine product based on the internal resistance at the time of shipping (see, e.g., Japanese Patent Laying-Open No. 2019-114437).

SUMMARY

In Japanese Patent Laying-Open No. 2019-114437, a genuine product is distinguished based on the internal resistance measured at the time of charging. For this reason, even if the materials forming a battery cell are different, when a battery cell having the same internal resistance is installed, the battery cell can be erroneously determined as a genuine product.

This disclosure has been made to solve such a problem, and aims to provide a determination system, a vehicle, and a determination method that are capable of determining whether a secondary battery is a genuine product or not even without charging or discharging it.

A determination system according to this disclosure is a determination system for a secondary battery that stores power used for running a vehicle and that is mounted on the vehicle in a replaceable state, the determination system comprising: a processor; a storage device that stores a genuine product characteristic that is a temperature change characteristic of a genuine product, the temperature change characteristic being a characteristic of an index which changes with temperature of the secondary battery and when not being charged or discharged; and a characteristic acquisition unit that acquires a determination target characteristic that is a temperature change characteristic of the index of the secondary battery after replacement mounted on the vehicle when not being charged or discharged. The processor compares the determination target characteristic acquired by the characteristic acquisition unit with the genuine product characteristic stored in the storage device, and determines whether the secondary battery mounted on the vehicle is the genuine product or not from a comparison result.

According to such a configuration, the acquired determination target characteristic that is a temperature change characteristic of the index of the secondary battery after replacement mounted on the vehicle when not being charged or discharged is compared with the stored genuine product characteristic that is a temperature change characteristic of a genuine product, the temperature change characteristic being a characteristic of the index which changes with the temperature of the secondary battery and when not being charged or discharged to determine whether the secondary battery mounted on the vehicle is the genuine product or not from a comparison result. As a result, it is possible to provide a determination system capable of determining whether a secondary battery is a genuine product or not even without charging or discharging it.

The index may be open circuit voltage of the secondary battery. According to such a configuration, even without charging or discharging a secondary battery, it can be determined whether it is a genuine product or not using open circuit voltage of the secondary battery.

The secondary battery may be configured to include a plurality of cells, and the index may be a binding load at which the plurality of cells are bound. According to such a configuration, even without charging or discharging a secondary battery, it can be determined whether it is a genuine product or not using a binding load at which a plurality of cells of the secondary battery are bound.

Furthermore, the binding load may be a binding load at a predetermined open circuit voltage. According to such a configuration, even without charging or discharging a secondary battery, it can be determined whether it is a genuine product or not using a binding load at which a plurality of cells of the secondary battery are bound at a predetermined open circuit voltage.

The secondary battery may be configured to include a plurality of cells, the index may be open circuit voltage of the secondary battery and a binding load at which the plurality of cells are bound, and the processor may: compare the determination target characteristic of the open circuit voltage acquired by the characteristic acquisition unit with the genuine product characteristic to determine whether or not a first difference between the determination target characteristic of the open circuit voltage and the genuine product characteristic is a first threshold or more; when determined that the first difference is the first threshold or more, determine that the secondary battery is not the genuine product; when determined that the first difference is less than the first threshold, compare the determination target characteristic of the binding load acquired by the characteristic acquisition unit with the genuine product characteristic to determine whether or not a second difference between the determination target characteristic of the binding load and the genuine product characteristic is a second threshold or more; when determined that the second difference is the second threshold or more, determine that the secondary battery is not the genuine product; and when determined that the second difference is less than the second threshold, determine that the secondary battery is the genuine product.

According to such a configuration, even without charging or discharging a secondary battery, it can more precisely be determined whether it is a genuine product or not using open circuit voltage of the secondary battery and a binding load at which a plurality of cells are bound.

The secondary battery may be configured to include a plurality of cells, the index may be open circuit voltage of the secondary battery and a binding load at which the plurality of cells are bound, and the processor: when a representative temperature value at which the determination target characteristic of the open circuit voltage is acquired by the characteristic acquisition unit is within a first temperature range, may compare the determination target characteristic of the open circuit voltage acquired by the characteristic acquisition unit with the genuine product characteristic to determine whether or not a first difference is a first threshold or more; when a representative temperature value at which the determination target characteristic of the binding load is acquired by the characteristic acquisition unit is within a second temperature range that is different from the first temperature range, compare the determination target characteristic of the binding load acquired by the characteristic acquisition unit with the genuine product characteristic to determine whether or not a second difference is a second threshold or more; when determined that the first difference is the first threshold or more or that the second difference is the second threshold or more, determine that the secondary battery is not the genuine product; and when determined that the first difference is less than the first threshold or that the second difference is less than the second threshold, determine that the secondary battery is the genuine product.

According to such a configuration, even without charging or discharging a secondary battery, it can more precisely be determined whether it is a genuine product or not using open circuit voltage of the secondary battery and a binding load at which a plurality of cells are bound.

The storage device may store information that can identify a graph indicating a relationship between a value of the index and temperature of the secondary battery as the genuine product characteristic, and the processor may compare a value of the index at each of a plurality of changed temperatures acquired by the characteristic acquisition unit with the graph.

According to such a configuration, even without charging or discharging a secondary battery, it can accurately be determined whether it is a genuine product or not.

According to another aspect of this disclosure, a determination system for a secondary battery is mounted on a vehicle. The secondary battery stores power used for running the vehicle and is mounted in a replaceable state. The determination system comprises: a processor; a storage device that stores a genuine product characteristic that is a temperature change characteristic of a genuine product, the temperature change characteristic being a characteristic of an index which changes with temperature of the secondary battery and when not being charged or discharged; and a characteristic acquisition unit that acquires a determination target characteristic that is a temperature change characteristic of the index of the secondary battery after replacement mounted on the vehicle when not being charged or discharged. The processor compares the determination target characteristic acquired by the characteristic acquisition unit with the genuine product characteristic stored in the storage device, and determines whether the secondary battery mounted on the vehicle is the genuine product or not from a comparison result.

According to such a configuration, it is possible to provide a vehicle capable of determining whether a secondary battery is a genuine product or not even without charging or discharging it.

According to still another aspect of this disclosure, a determination method is a determination method using a determination system for a secondary battery that stores power used for running a vehicle and that is mounted on the vehicle in a replaceable state. The determination system comprises: a processor; a storage device that stores a genuine product characteristic that is a temperature change characteristic of a genuine product, the temperature change characteristic being a characteristic of an index which changes with temperature of the secondary battery and when not being charged or discharged; and a characteristic acquisition unit that acquires a determination target characteristic that is a temperature change characteristic of the index of the secondary battery after replacement mounted on the vehicle when not being charged or discharged. The determination method comprises the processor: comparing the determination target characteristic acquired by the characteristic acquisition unit with the genuine product characteristic stored in the storage device, and determining whether the secondary battery mounted on the vehicle is the genuine product or not from a comparison result.

According to such a configuration, it is possible to provide a determination method capable of determining whether a secondary battery is a genuine product or not even without charging or discharging it.

The foregoing and other objects, features, aspects and advantages of the present disclosure will become more apparent from the following detailed description of the present disclosure when taken in conjunction with the accompanying drawings.

Figure 1:
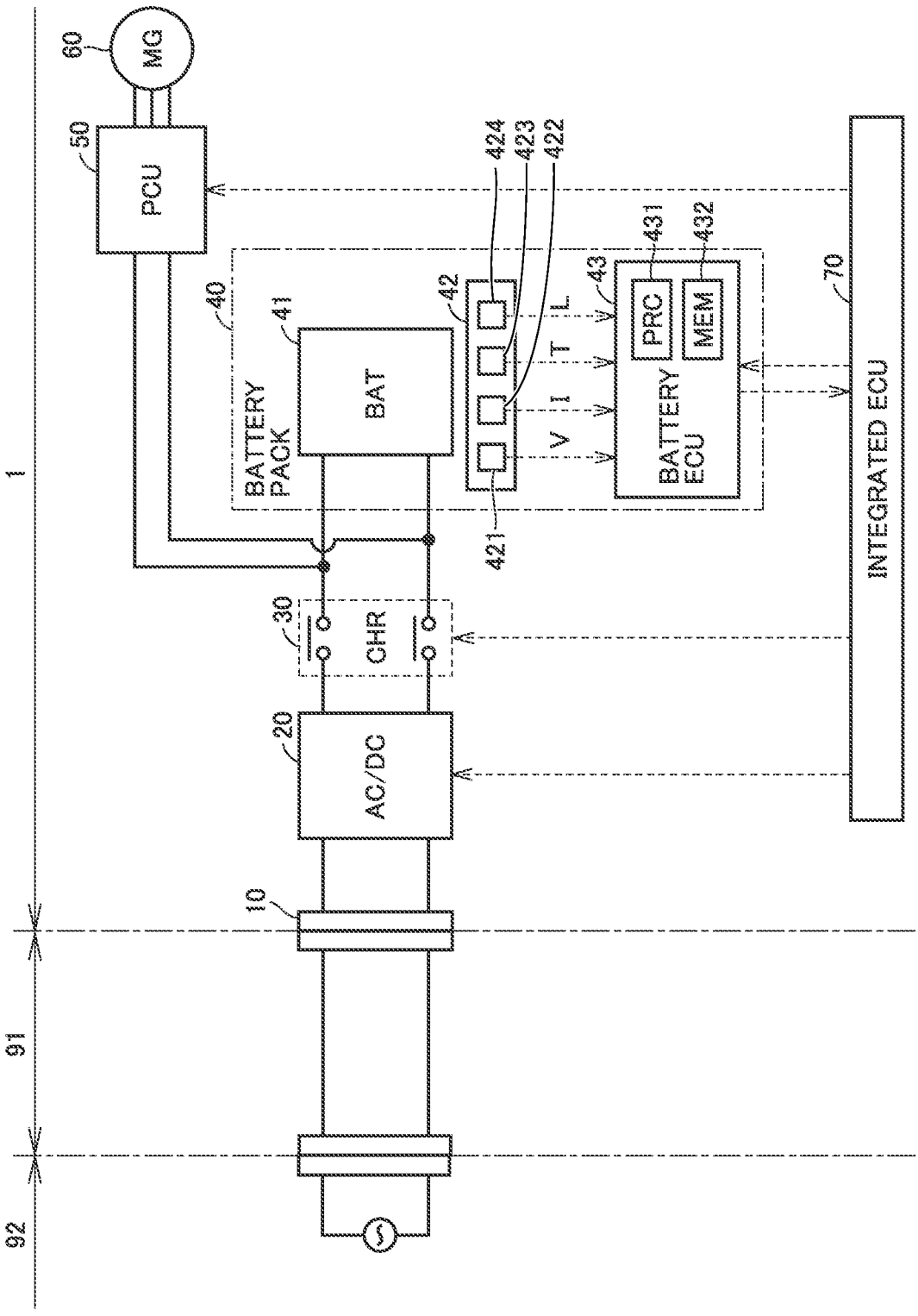
FIG. 1 is a diagram schematically showing an overall configuration of a vehicle on which a determination system according to this embodiment is mounted.

DESCRIPTION OF THE PREFERRED
EMBODIMENTS

Hereinafter, embodiments of the present disclosure will be described in detail with reference to the drawings. Note that the same or corresponding parts are given the same reference numeral in the drawings and descriptions thereof will not be repeated.

In the following embodiments, examples in which a "determination system" according to the present disclosure is mounted on a vehicle will be described.

However, applications of the "determination system" according to the present disclosure are not limited to being used for vehicles, and it may be used for, for example, stationary purposes.

First Embodiment

System Configuration

FIG. 1 is a diagram schematically showing an overall configuration of a vehicle 1 on which a determination system according to this embodiment is mounted. Vehicle 1 is a battery electric vehicle (BEV) in this embodiment. Though, the type of vehicle 1 is not limited to this as long as it is a vehicle on which a battery pack is mounted. Vehicle 1 may be a hybrid electric vehicle (HEV), a plug-in hybrid electric vehicle (PHEV), or a fuel cell electric vehicle (FCEV).

Vehicle 1 comprises an inlet 10, an AC/DC converter 20, a charge relay (CHR) 30, a battery pack 40, a power control unit (PCU) 50, a motor generator (MG) 60, and an integrated electronic control unit (ECU) 70. Battery pack 40 comprises a battery assembly 41, a monitoring unit 42, and a battery ECU 43 as a determination system.

Inlet 10 is configured so that a charging connector provided on a tip of a charging cable 91 can be inserted thereinto. Vehicle 1 and an external power supply (e.g., a grid power supply) 92 installed outside vehicle 1 are electrically connected via charging cable 91. Vehicle 1 is configured to enable "plug-in charging" which charges battery assembly 41 using power supplied from external power supply 92.

AC/DC converter 20 is electrically connected between inlet 10 and charge relay 30. AC/DC converter 20 converts alternating current power supplied from external power supply 92 via inlet 10 into direct current power, and outputs the direct current power to charge relay 30. Further, AC/DC converter 20 converts direct current power supplied from battery assembly 41 (or PCU 50) via charge relay 30 into alternating current power, and outputs the alternating current power to inlet 10.

Charge relay 30 is electrically connected on a power line connecting AC/DC converter 20 and battery assembly 41. Charge relay 30 is opened/closed according to a control signal from integrated ECU 70.

Battery assembly 41 stores power for driving motor generator 60, and supplies power to motor generator 60 through PCU 50. Further, battery assembly 41 is charged by power output from AC/DC converter 20 at the time of plug-in charging. Furthermore, battery assembly 41 is also charged by receiving generated power through PCU 50 at the time of power generation by motor generator 60 (e.g., regenerative power generation).

Monitoring unit 42 includes a voltage sensor 421, a current sensor 422, a temperature sensor 423, and a load sensor 424. Voltage sensor 421 detects voltage V of battery assembly 41. Current sensor 422 detects current I that is input to/output from battery assembly 41. Temperature sensor 423 is formed to include a thermistor or a thermocouple, and detects temperature T of battery assembly 41. Load sensor 424 detects a load L of battery assembly 41 (described later). Each sensor outputs a signal indicating its detection result to battery ECU 43.

Battery ECU 43 includes a processor 431 such as a CPU (central processing unit), a memory 432 such as a ROM (read only memory) and a RAM (random access memory), and an input/output port (not shown) for inputting/outputting various signals. Battery ECU 43 manages battery assembly 41 based on input of a signal from each sensor of monitoring unit 42 as well as a map and a program stored in memory 432 while cooperating with integrated ECU 70. Main processes executed by battery ECU 43 in this embodiment include a "determination process" for determining whether battery assembly 41 is a genuine product. The determination process by battery ECU 43 will be described later.

PCU 50 includes, for example, an inverter and a converter. PCU 50 performs bidirectional power conversion between battery assembly 41 and motor generator 60 in accordance with a control signal from integrated ECU 70.

Motor generator 60 is, for example, a three-phase alternating-current rotating electric machine in which permanent magnets are embedded in a rotor. Motor generator 60 rotates a driving shaft using power supplied from battery assembly 41. Further, motor generator 60 can also generate power by regenerative braking. Alternating current power generated by motor generator 60 is converted by PCU 50 into direct current power and charged into battery assembly 41.

Integrated ECU 70 includes a processor, a memory, and an input/output port (none is shown) as in battery ECU 43. Integrated ECU 70 controls equipment (AC/DC converter 20, charge relay 30, and PCU 50) so that vehicle 1 may enter a desired state based on input of a signal from each sensor provided on vehicle 1 as well as a map and a program stored in the memory. Integrated ECU 70 controls charging/discharging of battery assembly 41 by, for example, controlling AC/DC converter 20 and/or PCU 50. Note that ECU mounted on vehicle 1 may be configured in an integrated manner or configured to be divided for each function, as appropriate.

Structure of Battery Assembly

Figure 2:
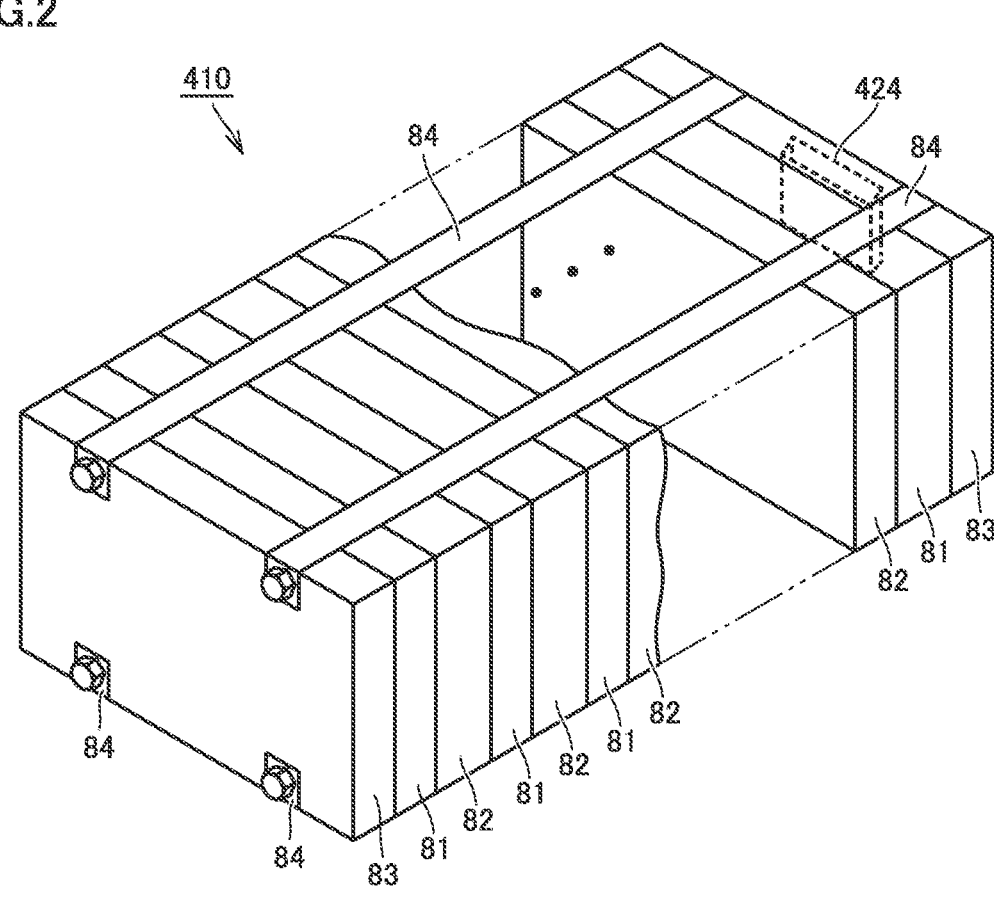
FIG. 2 is a perspective view schematically showing a structure of a battery assembly in this embodiment.
Figure 2:
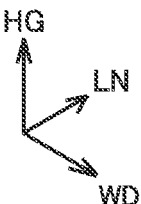

FIG. 2 is a perspective view schematically showing a structure of battery assembly 41 in this embodiment. Battery assembly 41 includes a plurality of stacks 410 (also referred to as modules or blocks). The plurality of stacks 410 may be connected to each other in series or in parallel. FIG. 2 shows one of the plurality of stacks 410 as a representative.

Stack 410 includes a plurality of cells 81, a plurality of resin frames 82, a pair of end plates 83, and a pair of binding bands 84. In stack 410, a stacked body is formed by stacking the plurality of cells 81 and the plurality of resin frames 82. In the following, the height direction of the stacked body is denoted as HG, the length direction (stacking direction) of the stacked body is denoted as LN, and the width direction of the stacked body is denoted as WD.

Each of the plurality of cells 81 is a secondary battery such as a lithium ion battery, an all-solid-state battery, or a nickel metal hydride battery. The number of cells included in stack 410 is not particularly limited. The configuration of each cell 81 is common. The configuration of cell 81 will be described in FIG. 3.

Each of the plurality of resin frames 82 is arranged between two adjacent cells 81 in stacking direction LN.

The pair of end plates 83 are arranged at one end and the other end in stacking direction LN of the stacked body. That is, the pair of end plates 83 are arranged so as to sandwich the stacked body from both sides in stacking direction LN.

The pair of binding bands 84 are arranged on the top and bottom surfaces of resin frame 82. The pair of binding bands 84 bind the pair of end plates 83 to each other with the stacked body sandwiched therebetween.

Figure 3:
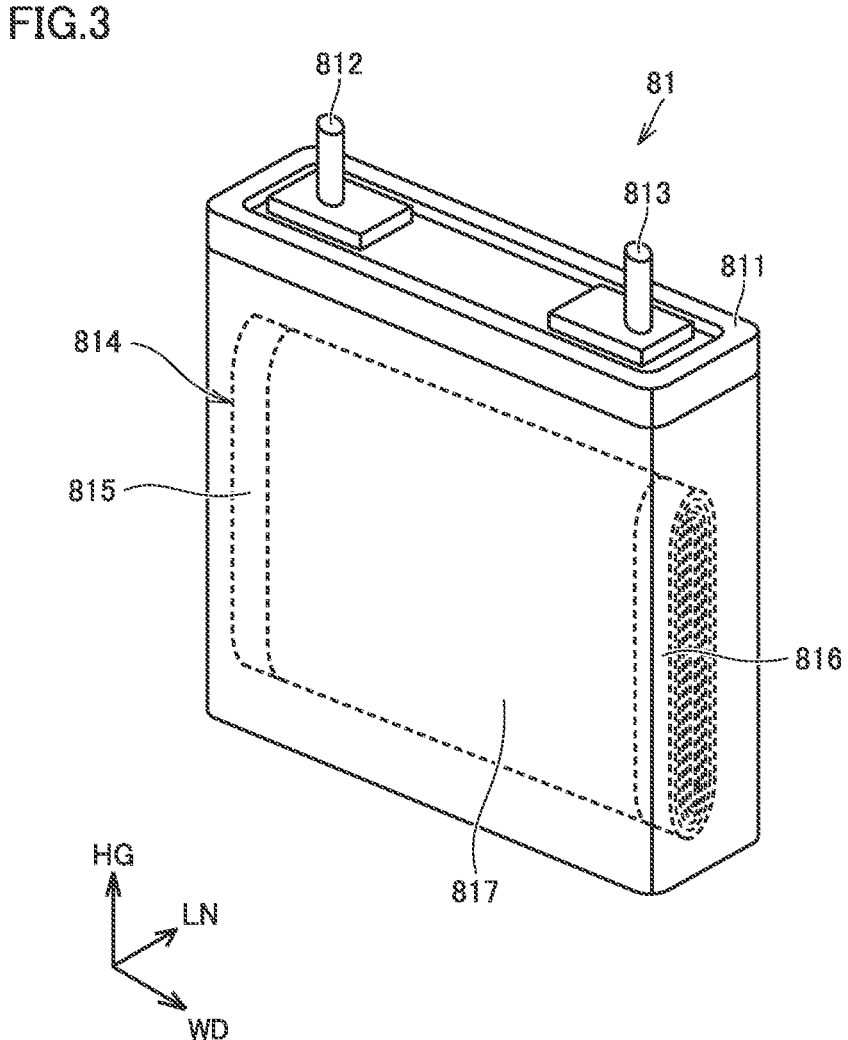
FIG. 3 is a transparent perspective view showing one example configuration of a cell.

FIG. 3 is a transparent perspective view showing one example configuration of cell 81. In this example, cell 81 is a lithium ion battery.

Cell 81 is a square cell having an approximately rectangular parallelepiped shape. The top surface of the case of cell 81 is sealed by a lid body 811. Lid body 811 is provided with a positive terminal 812 and a negative terminal 813. One end of each of positive terminal 812 and negative terminal 813 protrudes outside from lid body 811. The other ends of positive terminal 812 and negative terminal 813 are electrically connected to an internal positive terminal and an internal negative terminal (neither is shown), respectively, within the case. Note that although not shown, two adjacent cells 81 are electrically connected to each other via a bus bar.

An electrode assembly 814 is housed in the case. Electrode assembly 814 is formed by, for example, stacking a positive electrode 815 and a negative electrode 816 via a separator 817 and then cylindrically rolling them. Electrolyte solution is held by positive electrode 815, negative electrode 816, separator 817, and the like. Note that a stacked body can be adopted as electrode assembly 814 instead of a rolled body.

Configurations and materials that are conventionally known as a positive electrode, a negative electrode, a separator, and an electrolyte solution of a lithium ion secondary battery can be used for positive electrode 815, negative electrode 816, separator 817 and the electrolyte solution. As one example, positive electrode 815 includes NCM ($LiNi_{1/3}CO_{1/3}Mn_{1/3}O_2$) that is a positive electrode mixture and Aluminum (Al) foil that is positive electrode foil. Negative electrode 816 includes graphite (C) that is a negative electrode mixture and copper (Cu) foil that is negative electrode foil. Polyolefin (e.g., polyethylene or polypropylene) can be used for the separator. The electrolyte solution includes an organic solvent (e.g., a mixed solvent of DMC (dimethyl carbonate), EMC (ethyl methyl carbonate), and EC (ethylene carbonate)), lithium salt (e.g., $LiPF_6$), and an additive (e.g., LiBOB (lithium bis(oxalate)borate) or $Li[PF_2(C_2O_4)_2]$).

<Determination of Battery Assembly 41>

For the above-described battery assembly 41, it is conceivable to distinguish a genuine product based on the internal resistance measured at the time of charging. In this case, even if the materials forming cell 81 of battery assembly 41 are different, when cell 81 having the same internal resistance is installed, battery assembly 41 can be erroneously determined as a genuine product.

Therefore, memory 432 of battery ECU 43 stores a genuine product characteristic that is a temperature change characteristic of an index (e.g., open circuit voltage (also referred to as "OCV") of battery assembly 41, or load L at which stack 410 of battery assembly 41 are bound), which changes with the temperature of battery assembly 41, of a genuine product when not being charged or discharged. A characteristic acquisition unit (e.g., voltage sensor 421 and load sensor 424) acquires a determination target characteristic that is a temperature change characteristic of the index of battery assembly 41 after replacement mounted on vehicle 1 when not being charged or discharged. Processor 431 of battery ECU 43 compares the determination target characteristic acquired by the characteristic acquisition unit with the genuine product characteristic stored in memory

432 to determine whether battery assembly 41 mounted on vehicle 1 is a genuine product or not from the comparison result.

Thereby, the acquired determination target characteristic that is a temperature change characteristic of the index of battery assembly 41 after replacement mounted on vehicle 1 when not being charged or discharged is compared with the stored genuine product characteristic that is a temperature change characteristic of the index, which changes with the temperature of battery assembly 41, of a genuine product when not being charged or discharged to determine whether battery assembly 41 mounted on vehicle 1 is a genuine product or not from the comparison result. As a result, even without charging or discharging battery assembly 41, it can be determined whether it is a genuine product or not.

As shown in FIG. 2, load sensor 424 is provided in stacking direction LN of the stacked body of each stack 410. Load sensor 424 is formed to include a load cell, a tactile sensor, or the like. Load sensor 424 measures a variation in a load at which stack 410 is bound that accompanies a change in temperature of battery assembly 41 when not being charged or discharged.

Figure 4:
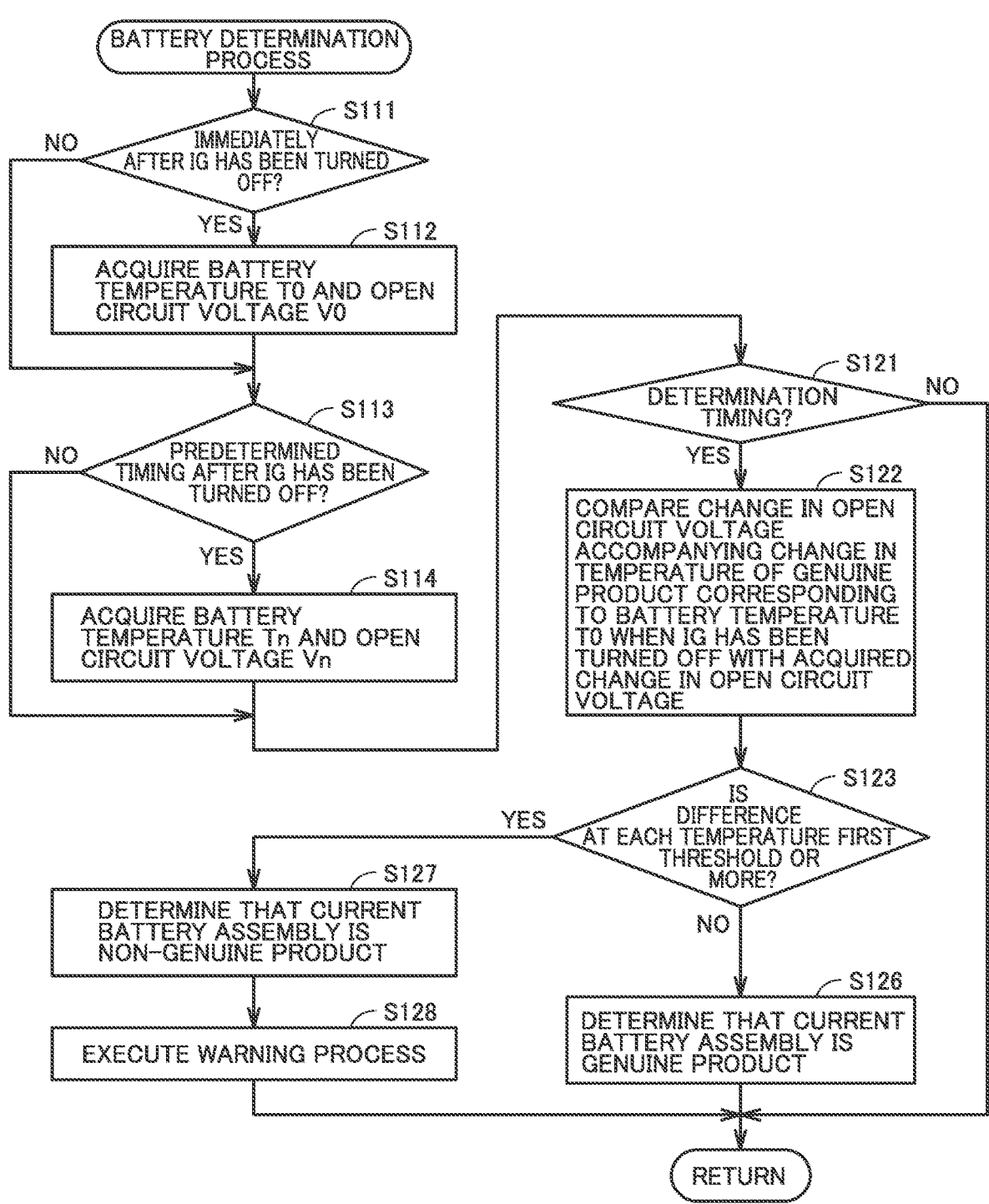
FIG. 4 is a flowchart showing a flow of a battery determination process in a first embodiment.

FIG. 4 is a flowchart showing a flow of a battery determination process in a first embodiment. This battery determination process is called and executed by processor 431 of battery ECU 43 from the upper-level process for each predetermined cycle. Referring to FIG. 4, processor 431 of battery ECU 43 determines whether or not it is immediately after the ignition switch (also referred to as "power switch") has been turned off (step S111). The phrase "immediately after it has been turned off" means a time when a relatively short time has elapsed since it has been turned off, for example, it may be a predetermined number of predetermined cycles (e.g., one predetermined cycle) after the turning-off has been detected, or may be a predetermined number of seconds (e.g., one second) after the turning-off has been detected.

When it is determined that it is immediately after the ignition switch has been turned off (YES in step S111), processor 431 acquires battery T0 and open circuit voltage V0 of battery assembly 41 based on detected values from temperature sensor 423 and voltage sensor 421, respectively (step S112).

After step S112 or when it is determined that it is not immediately after the ignition switch has been turned off (NO in step S111), processor 431 determines whether it is predetermined timing after the ignition switch has been turned off (step S113). The predetermined timing after it has been turned off may, for example, be a time when a predetermined time period (e.g., one hour) has elapsed since it has been turned off, or be a time when the battery temperature has changed (e.g., decreased) by a predetermined temperature (e.g., 10° C.) since it has been turned off. Further, the predetermined timing may be as predetermined, for example, may be timing for each predetermined time period, or may be timing at each change (e.g., decrease) in the battery temperature by a predetermined temperature (e.g., 5° C.).

When it is determined that it is the predetermined timing after the ignition switch has been turned off (YES in step S113), processor 431 acquires battery temperature Tn and open circuit voltage Vn of battery assembly 41 based on detected values from temperature sensor 423 and voltage sensor 421, respectively (step S114).

After step S114 or when it is determined that it is not the predetermined timing after the ignition switch has been turned off (NO in step S113), processor 431 determines whether or not it is timing to determine whether battery assembly 41 is a genuine product (step S121). The timing to determine whether battery assembly 41 is a genuine product may, for example, be immediately after the ignition switch has been turned on, or be timing when a specific time period (e.g., a predetermined time period such as five hours) has elapsed since the ignition switch has been turned off. The phrase "immediately after it has been turned on" means a time when a relatively short time has elapsed since it has been turned on, for example, it may be a predetermined number of predetermined cycles (e.g., one predetermined cycle) after the turning-on has been detected, or may be a predetermined number of seconds (e.g., one second) after the turning-on has been detected.

When it is determined that it is the determination timing (YES in step S121), processor 431 compares a change in open circuit voltage accompanying a change in temperature of a genuine product corresponding to battery temperature T0 when the ignition switch has been turned off that is stored in memory 432 with a change in open circuit voltage acquired in step S112 and step S114 (step S122).

Figure 5:
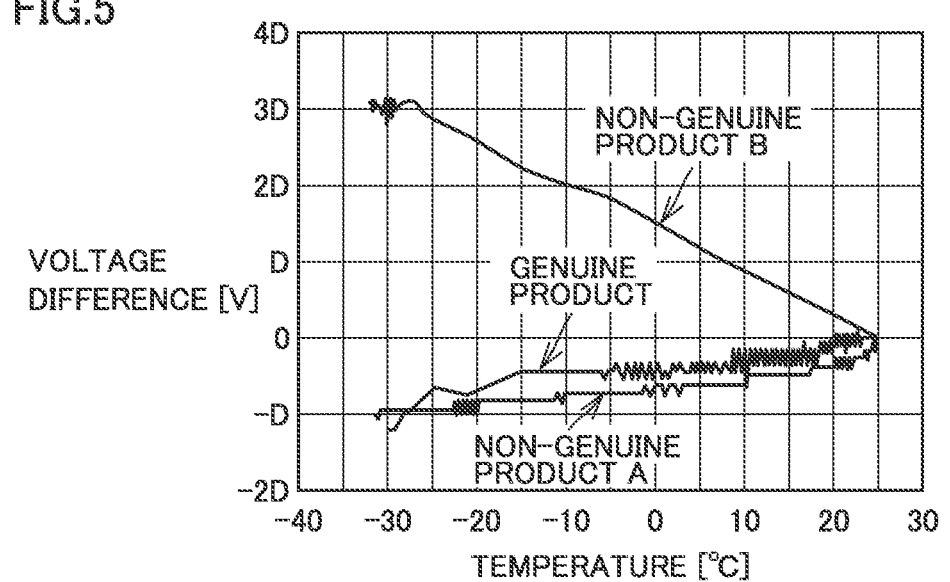
FIG. 5 is a graph showing a change in open circuit voltage with respect to a change in temperature of a genuine product and non-genuine products of a battery pack in this embodiment.

FIG. 5 is a graph showing a change in open circuit voltage with respect to a change in temperature of a genuine product and non-genuine products of battery assembly 41 in this embodiment. Open circuit voltage refers to voltage when battery assembly 41 is not energized. Referring to FIG. 5, this graph is a graph when the temperature of battery assembly 41 immediately after the ignition switch has been turned off is 25° ° C. Although at least data indicating a graph of a genuine product of battery assembly 41 is stored in advance in memory 432 of battery ECU 43, data indicating a graph of a non-genuine product may be stored. Further, data indicating a graph at each of a plurality of temperatures (e.g., temperatures at intervals of a predetermined temperature (e.g., 1° C.) within a predetermined range (e.g., −30° C. to +50° C.)) of battery assembly 41 immediately after the ignition switch has been turned off is stored in advance in memory 432 of battery ECU 43.

As shown in FIG. 5, for the genuine product and a non-genuine product A, as the temperature of battery assembly 41 decreases from 25° C., the voltage difference from the open circuit voltage of battery assembly 41 immediately after the ignition switch has been turned off gradually increases in the negative direction. That is, as the temperature decreases, the open circuit voltage decreases. On the other hand, for a non-genuine product B, as the temperature of battery assembly 41 decreases from 25° C., the voltage difference from the open circuit voltage of battery assembly 41 immediately after the ignition switch has been turned off increases in the positive direction. That is, as the temperature decreases, the open circuit voltage increases.

Turning back to FIG. 4, as a result of comparison in step S122, processor 431 determines whether or not a difference between the acquired open circuit voltage corresponding to acquired temperatures T0 and Tn and the value of the graph is a first threshold or more (step S123).

When it is determined that the difference is less than the first threshold (NO in step S123), processor 431 determines that current battery assembly 41 after replacement mounted on vehicle 1 is a genuine product (step S126).

On the other hand, it is determined that the difference is the first threshold or more (YES in step S123), processor 431 determines that current battery assembly 41 after replacement mounted on vehicle 1 is a non-genuine product (step S127), and executes a warning process (step S128). The warning process may, for example, be a process of issuing a warning on an HMI (human machine interface) of vehicle

1, a process of transmitting information indicating a warning to an external server such as a server of the manufacturer of vehicle 1, or a process of transmitting information indicating a warning to, for example, a mobile terminal of a user of vehicle 1 from this external server.

After step S126, after step S128, or when it is determined that it is not the determination timing (NO in step S121), processor 431 returns the process to be executed to the upper-level process from which this battery determination process is called.

Second Embodiment

In the first embodiment, the index used to determine whether battery assembly 41 is a genuine product is the open circuit voltage of battery assembly 41. In a second embodiment, the index used to determine whether battery assembly 41 is a genuine product is a binding load of stack 410 of battery assembly 41.

Figure 6:
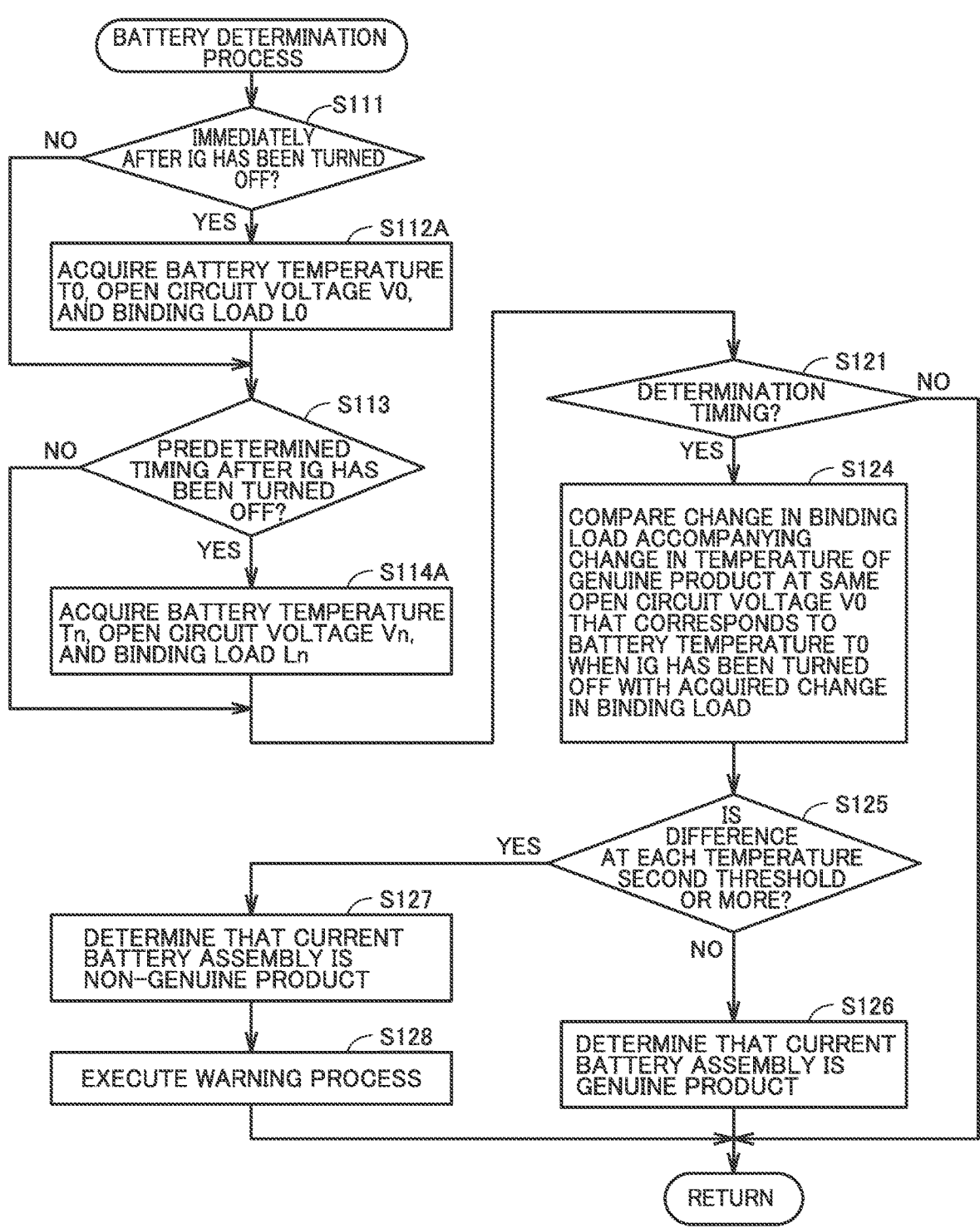
FIG. 6 is a flowchart showing a flow of a battery determination process in a second embodiment.

FIG. 6 is a flowchart showing a flow of a battery determination process in the second embodiment. This battery determination process is called and executed by processor 431 of battery ECU 43 from the upper-level process for each predetermined cycle. Note that in FIG. 6, processes having the same step numbers as in FIG. 4 are the same processes as in FIG. 4, so overlapping description will not be repeated.

When it is determined that it is immediately after the ignition switch has been turned off (YES in step S111), processor 431 acquires battery temperature T0, open circuit voltage V0, and a binding load L0 of battery assembly 41 based on detected values from temperature sensor 423, voltage sensor 421, and load sensor 424, respectively (step S112A).

When it is determined that it is predetermined timing after the ignition switch has been turned off (YES in step S113), processor 431 acquires battery temperature Tn, open circuit voltage Vn, and binding load Ln of battery assembly 41 based on detected values from temperature sensor 423, voltage sensor 421, and load sensor 424, respectively (step S114A).

When it is determined that it is the determination timing (YES in step S121), processor 431 compares a change in a binding load accompanying a change in temperature of a genuine product at the same open circuit voltage V0 that corresponds to battery temperature T0 when the ignition switch has been turned off that is stored in memory 432 with a change in a binding load acquired in step S112A and step S114A (step S124).

Figure 7:
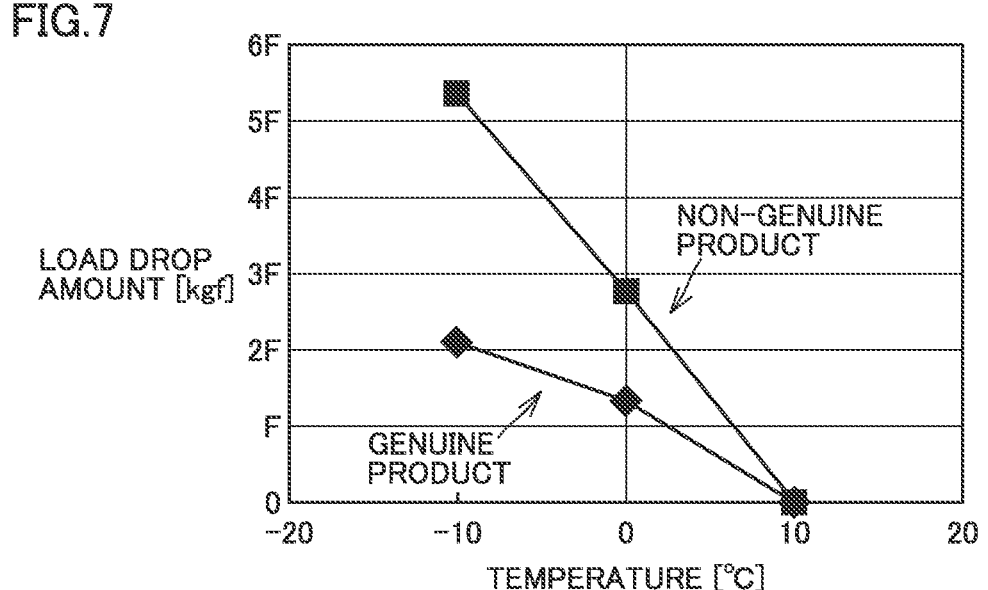
FIG. 7 is a graph showing a change in a binding load at the same open circuit voltage with respect to a change in temperature of a genuine product and a non-genuine product of a battery pack in this embodiment.

FIG. 7 is a graph showing a change in a binding load at the same open circuit voltage with respect to a change in temperature of a genuine product and a non-genuine product of battery assembly 41 in this embodiment. Referring to FIG. 7, this graph is a graph when the temperature of battery assembly 41 immediately after the ignition switch has been turned off is 10° C. Although at least data indicating a graph of a genuine product of battery assembly 41 is stored in advance in memory 432 of battery ECU 43, data indicating a graph of a non-genuine product may be stored. Further, data indicating a graph at each of a plurality of temperatures (e.g., temperatures at intervals of a predetermined temperature (e.g., 1° C.) within a predetermined range (e.g., −30° C. to +50° C.)) of battery assembly 41 immediately after the ignition switch has been turned off is stored in advance in memory 432 of battery ECU 43.

As shown in FIG. 7, an amount of increase in a load drop amount of a binding load with a decrease in temperature of battery assembly 41 from 10° C. is different between a genuine product and a non-genuine product.

Turning back to FIG. 6, as a result of comparison in step S122, processor 431 determines whether or not a difference between a load drop amount that is a difference of an acquired binding load Ln at acquired temperature Tn from binding load L0 and the value of the graph is a second threshold or more (step S125).

When it is determined that the difference is less than the second threshold (NO in step S125), processor 431 executes the process in step S126 described in FIG. 4. On the other hand, when it is determined that the difference is the second threshold or more (YES in step S125), processor 431 executes the processes in step S127 and step S128 described in FIG. 4.

Third Embodiment

In the first embodiment and the second embodiment, for example, one index of a plurality of indices such as open circuit voltage and a binding load is compared with an index of a genuine product to determine whether battery assembly 41 is a genuine product. In a third embodiment, two or more indices of the plurality of indices are used in a stepwise fashion to compare them with indices of a genuine product, thereby determining whether battery assembly 41 is a genuine product.

Figure 8:
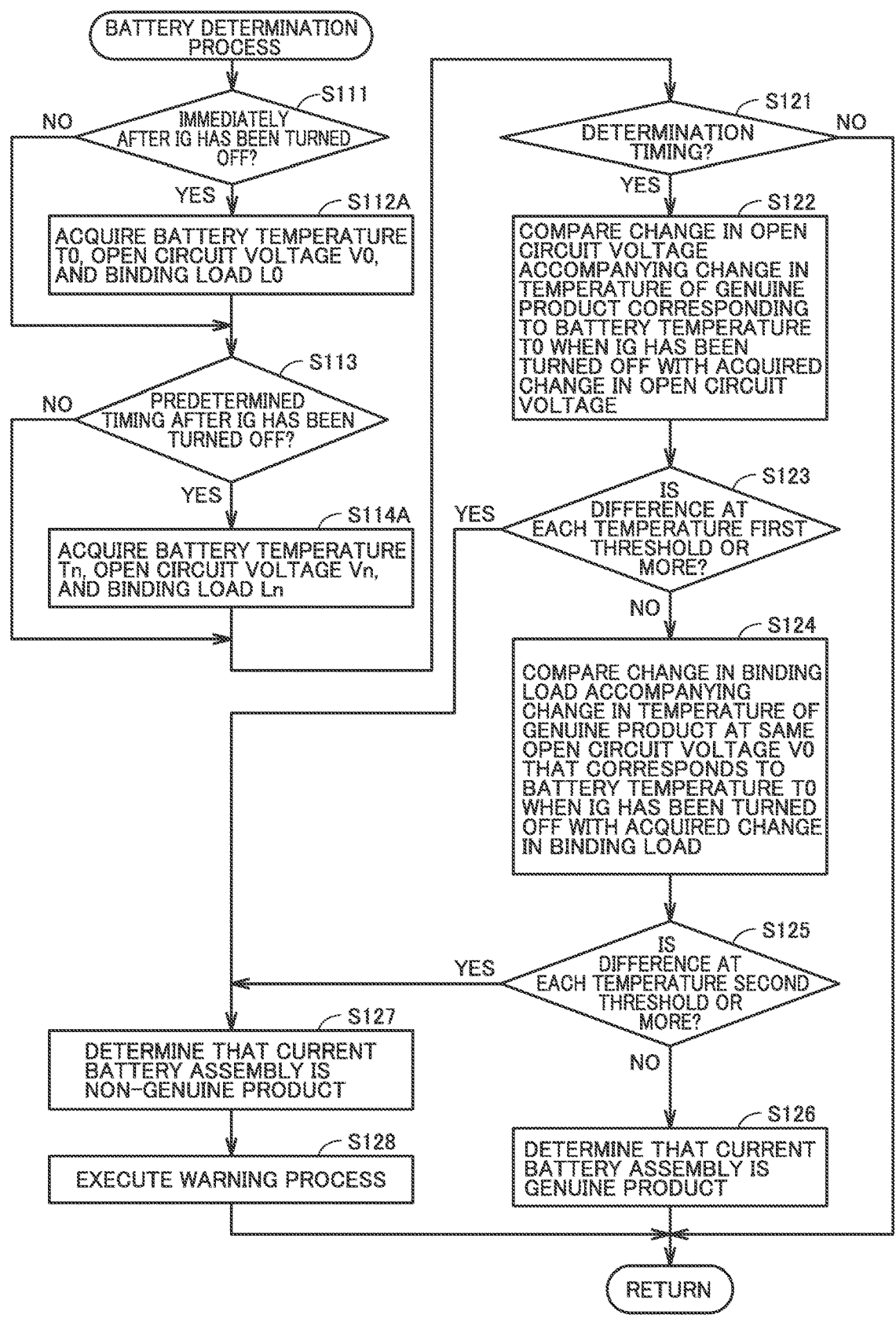
FIG. 8 is a flowchart showing a flow of a battery determination process in a third embodiment.

FIG. 8 is a flowchart showing a flow of a battery determination process in the third embodiment. This battery determination process is called and executed by processor 431 of battery ECU 43 from the upper-level process for each predetermined cycle. Note that in FIG. 8, processes having the same step numbers as in FIG. 4 and FIG. 6 are the same processes as in FIG. 4 and FIG. 6, so overlapping description will not be repeated.

In FIG. 8, when it is determined that the difference at each temperature is not the first threshold or more in step S123 in FIG. 4 (NO), processor 431 executes the processes after step S124 in FIG. 6.

Fourth Embodiment

In the third embodiment, two or more indices of the plurality of indices are used in a stepwise fashion to compare them with indices of a genuine product, thereby determining whether battery assembly 41 is a genuine product. In a fourth embodiment, an index of the plurality of indices that is different depending on a temperature range of battery assembly 41 is used to compare it with an index of a genuine product, thereby determining whether battery assembly 41 is a genuine product.

Figure 9:
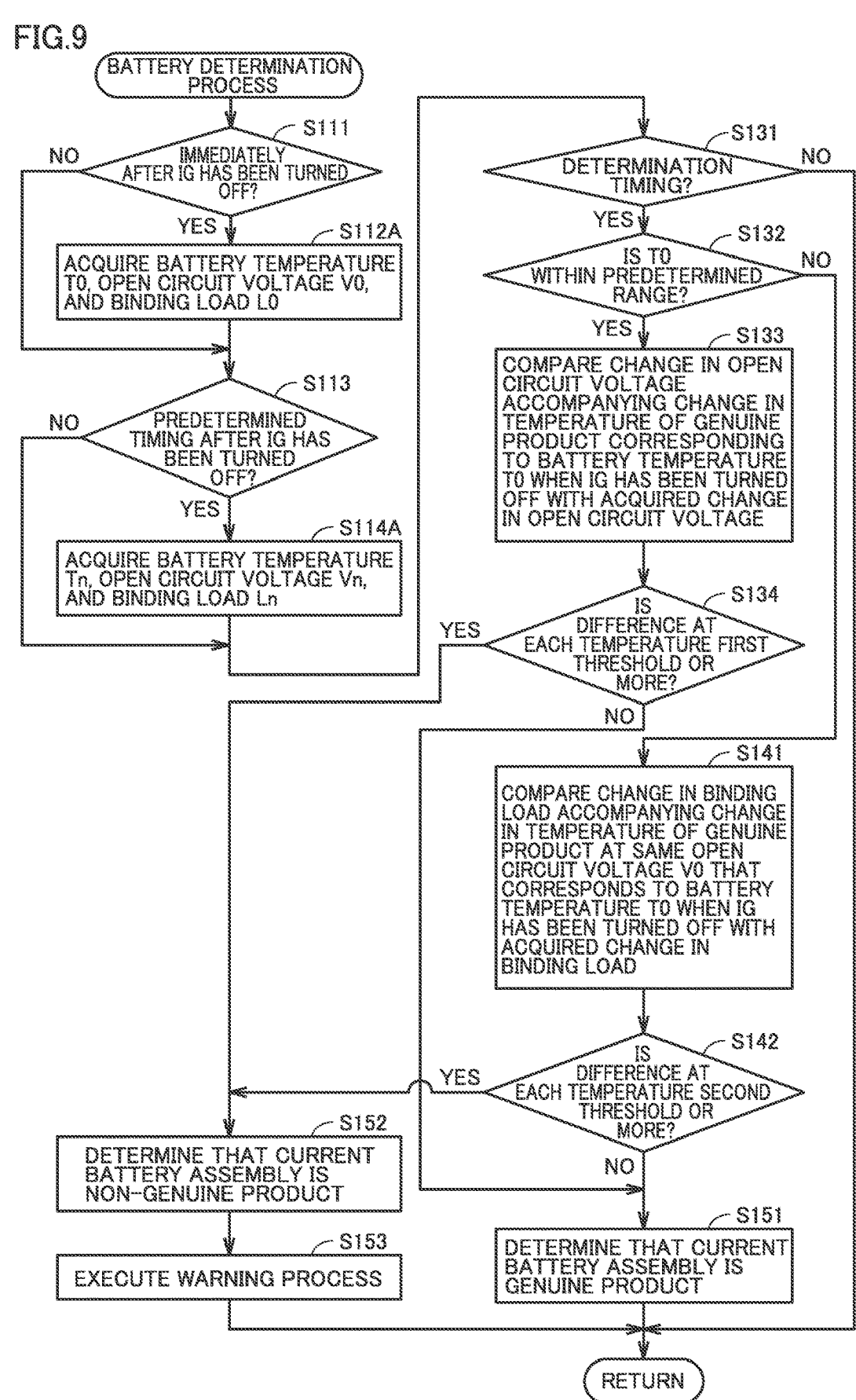
FIG. 9 is a flowchart showing a flow of a battery determination process in a fourth embodiment.

FIG. 9 is a flowchart showing a flow of a battery determination process in the fourth embodiment. This battery determination process is called and executed by processor 431 of battery ECU 43 from the upper-level process for each predetermined cycle. Note that in FIG. 9, processes having the same step numbers as in FIG. 4, FIG. 6 and FIG. 8 are the same processes as in FIG. 4, FIG. 6 and FIG. 8, so overlapping description will not be repeated.

Step S111 to step S114A are the same as in FIG. 6 and FIG. 8. After step S114A or when it is determined that it is not the predetermined timing after the ignition switch has been turned off (NO in step S113), processor 431 determines whether or not it is timing to determine whether battery assembly 41 is a genuine product as in step S121 in FIG. 4, FIG. 6, and FIG. 8 (step S131). When it is determined that it is not the determination timing (NO in step S131), processor 431 returns the process to be executed to the upper-level process from which this battery determination process is called.

On the other hand, when it is determined that it is the determination timing (YES in step S131), processor 431 determines whether battery temperature T0 of battery assembly 41 immediately after the ignition has been turned off that is acquired in step S112A is within a predetermined range or not (step S132). Here, the predetermined range is a temperature range of battery assembly 41 in which the accuracy of comparison with a genuine product using open circuit voltage is better than the accuracy of comparison with a genuine product using a binding load.

When it is determined that battery temperature T0 is within the predetermined range (YES in step S132), processor 431 compares a change in open circuit voltage accompanying a change in temperature of a genuine product corresponding to battery temperature T0 when the ignition switch has been turned off that is stored in memory 432 with a change in open circuit voltage acquired in step S112 and step S114, as in step S122 in FIG. 4 and FIG. 8 (step S133).

As a result of comparison in step S133, processor 431 determines whether or not a difference between the acquired open circuit voltage corresponding to acquired temperatures T0 and Tn and the value of the graph shown in FIG. 5 is the first threshold or more (step S134), as in step S123 in FIG. 4 and FIG. 8.

When it is determined that the difference is less than the first threshold (NO in step S134), processor 431 determines that current battery assembly 41 after replacement mounted on vehicle 1 is a genuine product (step S151), as in step S126 in FIG. 4, FIG. 6, and FIG. 8.

On the other hand, when it is determined that the difference is the first threshold or more (YES in step S134), processor 431 determines that current battery assembly 41 after replacement mounted on vehicle 1 is a non-genuine product (step S152) and executes a warning process (step S153), as in step S127 and step S128, respectively, in FIG. 4, FIG. 6, and FIG. 8.

When it is determined that battery temperature T0 is not within the predetermined range (NO in step S132), processor 431 compares a change in a binding load accompanying a change in temperature of a genuine product at the same open circuit voltage V0 that corresponds to battery temperature T0 when the ignition switch has been turned off that is stored in memory 432 with a change in a binding load acquired in step S112A and step S114A (step S141), as in step S124 in FIG. 6 and FIG. 8.

As a result of comparison in step S141, processor 431 determines whether or not a difference between a load drop amount that is a difference of acquired binding load Ln at acquired temperature Tn from binding load L0 and the value of the graph shown in FIG. 7 is the second threshold or more (step S142), as in step S125 in FIG. 6 and FIG. 8.

When it is determined that the difference is less than the second threshold (NO in step S142), processor 431 executes the process in step S151 described above. On the other hand, when it is determined that the difference is the second threshold or more (YES in step S142), processor 431 executes the processes in step S152 and step S153 described above.

Variants (1) In the aforementioned embodiments, the values of the index are acquired immediately after the ignition has been turned off and at the predetermined timing as shown in FIG.

4, FIG. 6, FIG. 8, and FIG. 9. However, without limitation to this, timing at which the value of the index is acquired may be other timing, as described in step S111 and step S113 in FIG. 4.

(2) In the aforementioned embodiments, a determination as a genuine product is made when a difference of open circuit voltage or a binding load at the same battery temperature is less than a predetermined threshold as shown in step S122 in FIG. 4 and FIG. 8, step S124 in FIG. 6 and FIG. 8, and step S133 and step S141 in FIG. 9. However, without limitation to this, methods of comparing the acquired value of open circuit voltage or a binding load with a graph of a genuine product may be other methods as long as they are methods of comparing the coincidence of both, for example, the coincidence may be evaluated by comparing an approximate line for a plurality of acquired values with the graph.

(3) In the aforementioned embodiments, changes in binding loads at the same open circuit voltage are compared as shown in step S124 in FIG. 6 and FIG. 8 and step S141 in FIG. 9. However, without limitation to this, irrespective of whether open circuit voltages are the same or not, changes in binding loads may be compared by regarding the open circuit voltages as the same.

(4) In the aforementioned embodiments, battery ECU 43 as a determination system for vehicle 1 determines whether battery assembly 41 is a genuine product. However, without limitation to this, an apparatus that determines whether battery assembly 41 is a genuine product is not limited to battery ECU 43 as a determination system, and may be an external device (a data logger or a server) that is communicable with vehicle 1.

When the determination system is battery ECU 43, an acquisition unit that acquires a temperature change characteristic of an index (e.g., open circuit voltage or a binding load) of battery assembly 41 after replacement mounted on vehicle 1 when not being charged or discharged is a sensor (e.g., voltage sensor 421 or load sensor 424) provided on vehicle 1. When the determination system is an external device, such an acquisition unit may be a communication unit of an external device that acquires a sensor value from vehicle 1.

(5) In the aforementioned embodiments, the predetermined timing in step S113 in FIG. 4, FIG. 6, FIG. 8, and FIG. 9 may be one timing as described above or may be a plurality of timings.

(6) The aforementioned embodiments can be regarded as disclosure of a determination system such as battery ECU 43 or vehicle 1 including the determination system, can be regarded as disclosure of a determination method or a determination program executed by the determination system or vehicle 1, or can be regarded as disclosure of an external device that executes this determination method or determination program.

SUMMARY (1) As shown in FIG. 1 to FIG. 3, a determination system (e.g., battery ECU 43 or an external device) is a system that determines battery assembly 41 that stores power used for running vehicle 1 and that is mounted on vehicle 1 in a replaceable state, the system comprising: a processor (e.g., processor 431 or, when the determination system is an external device, a CPU of the external device); a storage device (e.g., memory 432 or, when the determination system is an external device, a memory of the external device) that stores a genuine product characteristic that is a temperature change characteristic of a genuine product, the temperature change characteristic being a characteristic of an index which changes with temperature of battery assembly 41 and when not being charged or discharged; and a characteristic acquisition unit (e.g., voltage sensor 421 or load sensor 424, or, when the determination system is an external device, a communication unit) that acquires a determination target characteristic that is a temperature change characteristic of the index of battery assembly 41 after replacement mounted on vehicle 1 when not being charged or discharged. As shown in FIG. 4, FIG. 6, FIG. 8, and FIG. 9, the processor compares the determination target characteristic acquired by the characteristic acquisition unit with the genuine product characteristic stored in the storage device, and determines whether battery assembly 41 mounted on vehicle 1 is the genuine product or not from a comparison result (e.g., step S122 in FIG. 4 and FIG. 8, step S124 in FIG. 6 and FIG. 8, and step S133 and step S141 in FIG. 9).

Thereby, the acquired determination target characteristic that is a temperature change characteristic of the index of battery assembly 41 after replacement mounted on vehicle 1 when not being charged or discharged is compared with the stored genuine product characteristic that is a temperature change characteristic of the index, which changes with the temperature of battery assembly 41, of a genuine product when not being charged or discharged to determine whether battery assembly 41 mounted on vehicle 1 is the genuine product or not from a comparison result. As a result, even without charging or discharging battery assembly 41, it can be determined whether it is a genuine product or not.

(2) As shown in FIG. 4, FIG. 8, and FIG. 9, the index may be open circuit voltage of battery assembly 41. Thereby, even without charging or discharging battery assembly 41, it can be determined whether it is a genuine product or not using open circuit voltage of battery assembly 41.

(3) As shown in FIG. 2, battery assembly 41 is configured to include the plurality of cells 81. As shown in FIG. 6, FIG. 8, and FIG. 9, the index may be a binding load at which the plurality of cells 81 are bound. Thereby, even without charging or discharging battery assembly 41, it can be determined whether it is a genuine product or not using a binding load at which the plurality of cells 81 of battery assembly 41 are bound.

(4) As shown in FIG. 6, FIG. 8, and FIG. 9, the binding load may be a binding load at a predetermined open circuit voltage. Thereby, even without charging or discharging battery assembly 41, it can be determined whether it is a genuine product or not using a binding load at which the plurality of cells 81 of battery assembly 41 are bound at a predetermined open circuit voltage.

(5) As shown in FIG. 2, battery assembly 41 is configured to include the plurality of cells 81. As shown in FIG. 8, the index may be open circuit voltage of battery assembly 41 and a binding load at which the plurality of cells 81 are bound, and the processor: may compare the determination target characteristic of the open circuit voltage acquired by the characteristic acquisition unit with the genuine product characteristic (e.g., step S122) to determine whether or not a first difference between the determination target characteristic of the open circuit voltage and the genuine product characteristic is a first threshold or more (e.g., step S123); when determined that the first difference is the first threshold or more, determine that battery assembly 41 is not the genuine product (e.g., step S127); when determined that the first difference is less than the first threshold, compare the determination target characteristic of the binding load acquired by the characteristic acquisition unit with the genuine product characteristic (e.g., step S124) to determine whether or not a second difference between the determination target characteristic of the binding load and the genuine product characteristic is a second threshold or more (e.g., step S125); when determined that the second difference is the second threshold or more, determine that battery assembly 41 is not the genuine product (e.g., step S127); and when determined that the second difference is less than the second threshold, determine that battery assembly 41 is the genuine product (e.g., step S126).

Thereby, even without charging or discharging battery assembly 41, it can more precisely be determined whether it is a genuine product or not using open circuit voltage of battery assembly 41 and a binding load at which the plurality of cells 81 are bound.

(6) As shown in FIG. 2, battery assembly 41 is configured to include the plurality of cells 81. As shown in FIG. 9, the index may be open circuit voltage of battery assembly 41 and a binding load at which the plurality of cells 81 are bound, and the processor: when a representative temperature value at which the determination target characteristic of the open circuit voltage is acquired by the characteristic acquisition unit is within a first temperature range (e.g., a predetermined range) (e.g., when determined as YES in step S132), may compare the determination target characteristic of the open circuit voltage acquired by the characteristic acquisition unit with the genuine product characteristic (e.g., step S133) to determine whether or not a first difference is a first threshold or more (e.g., step S134); when a representative temperature value at which the determination target characteristic of the binding load is acquired by the characteristic acquisition unit is within a second temperature range that is different from the first temperature range (e.g., a range that is different from the predetermined range) (e.g., when determined as NO in step S132), may compare the determination target characteristic of the binding load acquired by the characteristic acquisition unit with the genuine product characteristic (e.g., step S141) to determine whether or not a second difference is a second threshold or more (e.g., step S142); when determined that the first difference is the first threshold or more or that the second difference is the second threshold or more, may determine that battery assembly 41 is not the genuine product (e.g., step S152); and when determined that the first difference is less than the first threshold or that the second difference is less than the second threshold, may determine that battery assembly 41 is the genuine product (e.g., step S151).

Thereby, even without charging or discharging battery assembly 41, it can more precisely be determined whether it is a genuine product or not using open circuit voltage of battery assembly 41 and a binding load at which the plurality of cells 81 are bound.

(7) As shown in FIG. 5 and FIG. 7, the storage device stores information that can identify a graph indicating a relationship between a value of the index and temperature of battery assembly 41 as the genuine product characteristic. As shown in FIG. 4, FIG. 6, FIG. 8, and FIG. 9, the processor may compare a value of the index at each of a plurality of changed temperatures acquired by the characteristic acquisition unit with the graph (e.g., step S122 in FIG. 4 and FIG. 8, step S124 in FIG. 6 and FIG. 8, and step S133 and step S141 in FIG. 9).

Thereby, even without charging or discharging battery assembly 41, it can accurately be determined whether it is a genuine product or not.

Although embodiments of the present disclosure have been described, the embodiments disclosed herein are not to be taken by way of limitation but by way of illustration in all respects. The scope of the present disclosure is defined by the claims, and it is intended to cover all modifications within the meaning and scope equivalent to the claims.

What is claimed is:

1. A determination system for a secondary battery that stores power used for running a vehicle, the secondary battery being mounted on the vehicle in a replaceable state, the determination system comprising:

a processor;

a storage device that stores a genuine product characteristic that is a temperature change characteristic of a genuine product, the temperature change characteristic of the genuine product being a characteristic of an index, which is a binding load applied to a restraining member bundling cells of a genuine product secondary battery and which changes with temperature of the genuine product secondary battery when not being charged or discharged; and a characteristic acquisition unit that acquires a determination target characteristic that is a temperature change characteristic of an index of the secondary battery after replacement and when the secondary battery is mounted on the vehicle and is not being charged or discharged, wherein the secondary battery is configured as a battery pack including a plurality of cells, and the index of the secondary battery is a binding load applied to a restraining member bundling the plurality of cells of the secondary battery and which changes with temperature of the secondary battery when not being charged or discharged, wherein the processor compares the determination target characteristic acquired by the characteristic acquisition unit with the genuine product characteristic stored in the storage device, and determines whether the secondary battery mounted on the vehicle is the genuine product or not from a comparison result.

2. The determination system according to claim 1, wherein the index of the secondary battery also includes open circuit voltage of the secondary battery.

3. The determination system according to claim 1, wherein the binding load is a binding load at a predetermined open circuit voltage.

4. The determination system according to claim 1, wherein the index of the secondary battery is open circuit voltage of the secondary battery and the binding load at which the plurality of cells are bound, and the processor compares a determination target characteristic of open circuit voltage acquired by the characteristic acquisition unit with the genuine product characteristic to determine whether or not a first difference between the determination target characteristic of the open circuit voltage and the genuine product characteristic is equal to or greater than a first threshold, when determined that the first difference is equal to or greater than the first threshold, determines that the secondary battery is not the genuine product, when determined that the first difference is less than the first threshold, compares a determination target characteristic of the binding load acquired by the characteristic acquisition unit with the genuine product characteristic to determine whether or not a second difference between the determination target characteristic of the binding load and the genuine product characteristic is equal to or greater than a second threshold, when determined that the second difference is equal to or greater than the second threshold, determines that the secondary battery is not the genuine product, and when determined that the second difference is less than the second threshold, determines that the secondary battery is the genuine product.

5. The determination system according to claim 1, wherein the index of the secondary battery is open circuit voltage of the secondary battery and the binding load at which the plurality of cells are bound, and the processor when a representative temperature value at which a determination target characteristic of open circuit voltage is acquired by the characteristic acquisition unit is within a first temperature range, compares the determination target characteristic of the open circuit voltage acquired by the characteristic acquisition unit with the genuine product characteristic to determine whether or not a first difference therebetween is equal to or greater than a first threshold, when a representative temperature value at which a determination target characteristic of the binding load is acquired by the characteristic acquisition unit is within a second temperature range that is different from the first temperature range, compares the determination target characteristic of the binding load acquired by the characteristic acquisition unit with the genuine product characteristic to determine whether or not a second difference therebetween is equal to or greater than a second threshold, when determined that the first difference is equal to or greater than the first threshold or that the second difference is equal to or greater than the second threshold, determines that the secondary battery is not the genuine product, and when determined that the first difference is less than the first threshold or that the second difference is less than the second threshold, determines that the secondary battery is the genuine product.

6. The determination system according to claim 1, wherein the storage device stores information that can identify a graph indicating a relationship between a value of the index and temperature of the genuine product secondary battery as the genuine product characteristic, and the processor compares a value of the index of the secondary battery at each of a plurality of changed temperatures acquired by the characteristic acquisition unit with the graph.

7. A vehicle on which a determination system for a secondary battery is mounted, wherein;

the secondary battery stores power used for running the vehicle and the secondary battery is mounted on the vehicle in a replaceable state, the determination system comprises:

a processor;

a storage device that stores a genuine product characteristic that is a temperature change characteristic of a genuine product, the temperature change characteristic of the genuine product being a characteristic of an index, which is a binding load applied to a restraining member bundling cells of a genuine product secondary battery and which changes with temperature of the genuine product secondary battery when not being charged or discharged; and a characteristic acquisition unit that acquires a determination target characteristic that is a temperature change characteristic of an index of the secondary battery after replacement and when the secondary battery is mounted on the vehicle and is not being charged or discharged, the secondary battery is configured as a battery pack including a plurality of cells, and the index of the secondary battery is a binding load applied to a restraining member bundling the plurality of cells of the secondary battery and which changes with temperature of the secondary battery when not being charged or discharged, and the processor compares the determination target characteristic acquired by the characteristic acquisition unit with the genuine product characteristic stored in the storage device, and determines whether the secondary battery mounted on the vehicle is the genuine product or not from a comparison result.

8. A determination method using a determination system for a secondary battery that stores power used for running a vehicle, the secondary battery being mounted on the vehicle in a replaceable state, the determination method comprising:

reading, from a storage device, a genuine product characteristic that is a temperature change characteristic of an index which is a binding load applied to a retraining member bundling a plurality of cells of a genuine product secondary battery and which changes with temperature of the genuine product secondary battery and when not being charged or discharged; and acquiring, while a replacement secondary battery is mounted on the vehicle and is not being charged or discharged, a determination target characteristic that is a temperature change characteristic of an index of the replacement secondary battery, wherein the replacement secondary battery is a battery pack including a plurality of cells, and the index of the replacement secondary battery is a binding load applied to a restraining member bundling the plurality of cells of the replacement secondary battery and which changes with temperature of the replacement secondary battery when not being charged or discharged;

comparing the determination target characteristic with the genuine product characteristic; and determining whether the replacement secondary battery mounted on the vehicle is the genuine product or not from a comparison result.

* * * * *